(12) United States Patent
Gabric et al.

(10) Patent No.: US 7,755,160 B2
(45) Date of Patent: Jul. 13, 2010

(54) PLASMA EXCITED CHEMICAL VAPOR DEPOSITION METHOD SILICON/OXYGEN/NITROGEN-CONTAINING-MATERIAL AND LAYERED ASSEMBLY

(75) Inventors: Zvonimir Gabric, Zorneding (DE); Werner Pamler, Munich (DE); Guenther Schindler, Munich (DE)

(73) Assignee: Infineon Technologies AG, Munich (DE)

( * ) Notice: Subject to any disclaimer, the term of this patent is extended or adjusted under 35 U.S.C. 154(b) by 194 days.

(21) Appl. No.: 10/586,788

(22) PCT Filed: Jan. 22, 2005

(86) PCT No.: PCT/DE2005/000088

§ 371 (c)(1), (2), (4) Date: Sep. 2, 2008

(87) PCT Pub. No.: WO2005/071739

PCT Pub. Date: Aug. 4, 2005

(65) Prior Publication Data

US 2008/0308898 A1    Dec. 18, 2008

(30) Foreign Application Priority Data

Jan. 22, 2004    (DE) .................. 10 2004 003 337

(51) Int. Cl.
H01L 21/314 (2006.01)
H01L 21/469 (2006.01)

(52) U.S. Cl. ............. 257/508; 257/522; 257/E23.002; 257/E21.267; 438/763; 438/584

(58) Field of Classification Search ............. 257/572, 257/E23.002, E21.267, 506, 508, 522; 438/763, 438/618, 619, 584, 681
See application file for complete search history.

(56) References Cited

U.S. PATENT DOCUMENTS 5,260,600 A    11/1993    Harada (Continued)

FOREIGN PATENT DOCUMENTS

DE    41 18 165 A1    12/1991

(Continued)

OTHER PUBLICATIONS

Arnal, V., et al., "Integration of a 3 Level Cu-$Si_{O2}$ Air Gap Interconnect for Sub 0.1 micron CMOS Technologies," IEEE, 2001, 3 pages.

*Primary Examiner*—Thomas L Dickey
*Assistant Examiner*—Nikolay Yushin
(74) *Attorney, Agent, or Firm*—Slater & Matsil, L.L.P.

(57) ABSTRACT

A method for producing a layer arrangement is disclosed. A layer of oxygen material and nitrogen material is formed over a substrate that has a plurality of electrically conductive structures and/or over a part of a surface of the electrically conductive structures. The layer is formed using a plasma-enhanced chemical vapor deposition process with nitrogen material being supplied during the supply of silicon material and oxygen material by means of an organic silicon precursor material. The layer of oxygen material and nitrogen material is formed in such a manner that an area free of material remains between the electrically conductive structures. An intermediate layer including an electrically insulating material is formed over the layer of oxygen material and nitrogen material. A covering layer is selectively formed over the intermediate layer such that the area free of material between the electrically conductive structures is sealed from the environment and forms a cavity.

17 Claims, 4 Drawing Sheets

U.S. PATENT DOCUMENTS

| | | | |
|---|---|---|---|
| 5,407,860 A | 4/1995 | Stoltz et al. | |
| 5,759,913 A | 6/1998 | Fulford, Jr. et al. | |
| 5,792,706 A | 8/1998 | Michael et al. | |
| 5,837,618 A | 11/1998 | Avanzino et al. | |
| 6,208,015 B1 | 3/2001 | Bandyopadhyay et al. | |
| 6,211,057 B1 | 4/2001 | Lin et al. | |
| 6,423,629 B1 | 7/2002 | Ahn et al. | |
| 6,440,839 B1 | 8/2002 | Partovi et al. | |
| 6,445,072 B1 | 9/2002 | Subramanian et al. | |
| 6,524,948 B2 | 2/2003 | Tamaoka et al. | |
| 6,686,643 B2 | 2/2004 | Schwarzl et al. | |
| 6,803,318 B1 * | 10/2004 | Qiao et al. | 438/700 |
| 6,861,332 B2 | 3/2005 | Park et al. | |
| 6,914,011 B2 * | 7/2005 | Hayashide et al. | 438/758 |
| 7,033,926 B2 | 4/2006 | Schindler et al. | |
| 7,071,091 B2 | 7/2006 | Clarke et al. | |
| 2001/0019903 A1 | 9/2001 | Shufflebotham et al. | |
| 2003/0176055 A1 | 9/2003 | Wu | |
| 2003/0183940 A1 | 10/2003 | Noguchi et al. | |
| 2004/0084749 A1 | 5/2004 | Pamler et al. | |
| 2004/0124446 A1 | 7/2004 | Borger et al. | |
| 2005/0012219 A1 | 1/2005 | Liou | |
| 2005/0067673 A1 | 3/2005 | Geffken et al. | |
| 2005/0074961 A1 | 4/2005 | Beyer et al. | |
| 2005/0079700 A1 * | 4/2005 | Schindler et al. | 438/618 |
| 2006/0057835 A1 | 3/2006 | Anderson et al. | |
| 2006/0084236 A1 * | 4/2006 | Vogt | 438/381 |
| 2006/0105581 A1 * | 5/2006 | Bielefeld et al. | 438/786 |

FOREIGN PATENT DOCUMENTS

| | | |
|---|---|---|
| DE | 199 57 302 A1 | 5/2001 |
| DE | 101 09 778 A1 | 9/2002 |
| DE | 101 25 019 A1 | 12/2002 |
| DE | 101 40 754 A1 | 3/2003 |
| DE | 102 46 830 A1 | 2/2004 |
| DE | 103 41 544 A1 | 4/2005 |
| JP | 6216122 | 8/1994 |
| WO | WO 02/095820 A2 | 11/2002 |
| WO | WO 03 019649 A2 | 3/2003 |
| WO | WO03102264 * | 3/2003 |

* cited by examiner

PLASMA EXCITED CHEMICAL VAPOR DEPOSITION METHOD SILICON/OXYGEN/NITROGEN-CONTAINING-MATERIAL AND LAYERED ASSEMBLY

TECHNICAL FIELD

The invention relates to a plasma-enhanced chemical vapor deposition process, to a material containing silicon, oxygen and nitrogen, and to a layer arrangement.

BACKGROUND

Integrated circuit arrangements are produced with an ever greater packing density. This means that interconnects in metallizing layers have an ever shorter separation between them. In consequence, capacitances which are formed between the interconnects and lead to long signal delay times, to high power losses and to undesirable crosstalk, that is to say, which lead to an interaction between signals applied to adjacent interconnects, are increasing.

Silicon oxide is frequently used as a dielectric, as the isolation material between the interconnects, and its relative dielectric constant is $\in_r=3.9$.

So-called low-k materials, that is to say materials with a low $\in_r$ value as the material for the intermetal dielectrics, are used in order to reduce the relative dielectric constant $\in_r$, and this leads to a reduction in the value of the coupling capacitances between interconnects embedded in an insulation material.

It is also known from the prior art, that cavities are produced between interconnects within an interconnect layer, in order to reduce the value of the relative dielectric constant, and thus the value of the coupling capacitance. The insulating dielectric which governs the capacitance between the interconnects has a relative dielectric constant $\in_r$ which is approximately equal to unity in the area of the cavities. The interconnects themselves are surrounded by a material layer, composed of silicon oxide or a low-k material, in order to decouple them from the surrounding area.

The high coupling capacitances C between adjacent interconnects, which are becoming ever greater as circuits become increasingly miniaturized, are leading together with the resistance R of an interconnect to an RC switching delay for signals transported on the interconnects. This RC switching delay can be reduced using airgaps as an alternative to low-k materials, since the use of airgaps between interconnects, as the isolation material between metallization paths, considerably reduces the effective dielectric constant $\in_r$. By way of example, [1] to [4] disclose possible ways to provide airgaps.

In order to seal and to close a cavity between adjacent interconnects from the outside, a cavity or trench such as this in a layer arrangement can be sealed by the deposition of a covering layer, covering the trench. When sealing a trench-like cavity between interconnects, the aim is to deposit the material of such a covering layer well on the uppermost layer, but in contrast not to enter the trench and thus not to undesirably fill the cavity between adjacent interconnects with material, which would once again increase the relative dielectric constant $\in_r$ between the interconnects.

Silicon oxide formed by ozone-activated decomposition of tetraethyl orthosilicate (TEOS) (so-called "ozone/TEOS") is suitable as a material for a covering layer such as this, and can be deposited selectively well on silane-based silicon oxide as the material of the uppermost layer, but not in contrast on the silicon nitride as the material in the interior of the trench. Selective deposition means that the material to be deposited as the covering layer to close the cavity grows on silane-based silicon oxide, but in contrast does not grow, or grows at only a very slow rate, on silicon nitride.

Thus, according to the prior art, silicon nitride is frequently used as the material between airgap structures between interconnects, while in contrast a surface layer on which a covering layer is to be grown in a layer arrangement such as this is frequently formed from silane-based silicon oxide. However, this material configuration has the disadvantage that an RC switching delay which is excessive for many applications occurs, because of the high relative dielectric constant of silicon nitride ($\in_r=8$).

[5] discloses a method for formation of a silicon oxynitride layer by means of a CVD method, using a plasma and a mixing gas, with the mixing gas containing an organic silane gas and a nitride gas on and between interconnects on a semiconductor chip. The silicon oxynitride layer has good edge coverage, according to the statements in [5].

Other methods for formation of a silicon oxynitride layer with good edge coverage are described in [6] and [7].

[8] describes the formation of a structure with airgaps between the interconnects. The layer formed with airgaps is, however, formed using $SiH_4$, and thus using an inorganic silicon precursor material.

Another airgap structure is described in [9], in which case this structure is produced using only one "airgap layer" and, in order to increase the "aspect ratio" between the interconnects and thus in order to automatically form airgaps, a pad oxide layer, which is additionally applied to the interconnects.

SUMMARY

The invention is based in particular on the problem of providing a material, a method for production of the material, and a layer arrangement with this material, which material has a sufficiently low relative dielectric constant and cannot be deposited, or can be deposited only poorly selectively, on ozone/TEOS.

The problem is solved by a plasma-enhanced chemical vapor deposition process, by a material containing silicon, oxygen and nitrogen, and by a layer arrangement having the features as claimed in the independent patent claims.

In the plasma-enhanced chemical vapor deposition process according to the invention for formation of a material containing silicon, oxygen and nitrogen, nitrogen material is supplied using an organic silicon precursor material during the supply of the silicon material and oxygen material.

Furthermore, according to the invention, a material containing silicon, oxygen and nitrogen is provided, and is produced using the features described above, according to the plasma-enhanced chemical vapor deposition process.

The layer arrangement according to the invention contains a substrate and two electrically conductive structures on the substrate. At least a subarea between the two electrically conductive structures is free of material. Material containing silicon, oxygen and nitrogen and having the features described above is formed at least partially on and/or between the two electrically conductive structures. Furthermore, the layer arrangement contains an intermediate layer composed of electrically insulating material on the material which contains silicon, oxygen and nitrogen, and a covering layer which is formed selectively on the intermediate layer, by means of which the material-free area between the two electrically conductive structures is sealed from the environment.

One basic idea of the invention is the provision of a production method for a material containing silicon, oxygen and nitrogen, by means of which method a material is produced which contains predominantly silicon-oxygen components and thus has a relative dielectric constant which is similarly low to that of silicon oxide ($\in_r=3.9$). The material containing silicon, oxygen and nitrogen and produced on the basis of the plasma-enhanced chemical vapor deposition process according to the invention additionally contains rather small amounts of nitrogen (preferably in the single-digit percentage range). The nitrogen component of the material containing silicon, oxygen and nitrogen and produced by means of the method according to the invention results, as can be seen, in characteristics similar to silicon nitride with regard to the capability to deposit ozone/TEOS. In other words, the material of the invention is highly unsuitable for allowing ozone/TEOS to be deposited on it. The combination of a low-k-value and a small tendency to be used as a carrier for the deposition of ozone/TEOS results in the material produced according to the invention being excellently suitable for use as an intermetal dielectric for an integrated circuit having airgap structures.

In other words, the material produced according to the invention essentially has the good dielectric characteristics of silicon oxide (that is to say a low relative dielectric constant value and thus a short RC switching delay), while at the same time the material composition (probably in particular the nitrogen component in it) has the effect that the material which is formed on the basis of an organic precursor has material characteristics similar to those for silicon nitride in terms of the selective deposition of ozone/TEOS. This thus results in an ideal material for the intermetal dielectric between interconnects in a low-k arrangement. The good mechanical stability of the material also allows airgaps to be formed between structures of the material.

The invention thus makes it possible to replace the silicon nitride which is used according to the prior art as the material between airgaps by a material based on silicon oxide, without losing the advantages of selective deposition.

According to the invention, this material is produced in that, apart from an organic silicon precursor material as the source for the silicon component and the oxygen component of the material according to the invention, nitrogen material is additionally introduced into the PECVD process chamber ("plasma enhanced chemical vapor deposition"), thus resulting in the material according to the invention. Clearly, when using this method, small amounts of nitrogen are incorporated in a matrix based essentially on silicon-oxide material, and this leads to the advantageous combination of material characteristics.

Silicon oxide is frequently deposited using a plasma-activated TEOS process (so-called "PE-TEOS"). Based on the observation that no ozone/TEOS deposition, or only a very small amount of ozone/TEOS deposition, takes place on silicon nitride, nitrogen is added, according to the invention, to the PE-TEOS process. The incorporation of small amounts of nitrogen, typically in the percentage range, makes it possible to greatly increase the selectivity of the ozone/TEOS deposition so that no deposition of ozone/TEOS, or only an extremely small amount of deposition of ozone/TEOS, takes place on the layer, in a similar manner to that with silicon nitride. At the same time, the characteristics of silicon oxide are largely retained. The effective dielectric constant of an airgap structure with the modified PE-TEOS decreases, depending on the geometry, from values in the region of three to values of about two, in comparison to the variants with silicon nitride.

The layers containing silicon oxide, produced using the method according to the invention and with nitrogen material incorporated in them, typically have a refractive index of n=1.5, while in contrast silicon oxide produced by means of thermal oxidation has a refractive index of 1.45. The nitrogen content of the material according to the invention is typically in the atomic percentage range. Deposition of ozone/TEOS does not take place, or takes place only very poorly, on this type of silicon oxide provided with small amounts of nitrogen.

The essential factor for achieving the advantageous material characteristics of the material according to the invention is the use of an organic (that is to say based on carbon compounds) silicon precursor material, preferably tetraethyl orthosilicate (TEOS), also referred to as tetraethoxysilane. For example, the material with the advantageous characteristics cannot be obtained using the inorganic material silane ($SiH_4$).

The plasma-enhanced chemical vapor deposition process (PECVD) used according to the invention is a specific technique within the more general CVD method ("chemical vapor deposition").

The CVD method is a coating technology for deposition of thin layers from the gas phase on a solid substrate. The principle of the CVD method is that gaseous initial materials, so-called precursors, are passed over a substrate and are chemically decomposed into their components, as a result of which a new layer grows on the substrate surface. The decomposition of the precursors is generally carried out thermally, that is to say by heating the substrate. The actual deposition takes place with the involvement of a chemical reaction. For example, a volatile gaseous component reacts with another gas to form a solid material, which is deposited on the substrate. However, the process temperatures in the CVD process are relatively high.

The plasma-enhanced chemical vapor deposition process can be carried out at considerably lower process temperatures. While, in the case of a CVD process, the vapor reaction is initiated by thermal energy by heating the substrate, a PECVD method is based on changing a gas to the plasma state in the vicinity of the substrate surface. One of the reaction products is in this case a solid substance, which is precipitated on the surface, as a result of which a new layer composed of the material according to the invention is formed. A plasma is ignited by a strong alternating electrical field in a PECVD reactor, between the substrate holder, which acts as one electrode, and a further electrode. The energy of the field breaks bonds of the gas molecules introduced into the PECVD reactor, and breaks down the gas molecules.

According to a further aspect of the invention, a method is provided for production of a layer arrangement in which a layer composed of oxygen material nitrogen material is formed over a substrate having a plurality of electrically conductive structures and/or over a part of the surface of the electrically conductive structures, by means of a plasma-enhanced chemical vapor deposition process, with nitrogen material being supplied, during the supply of silicon material and oxygen material, by means of an organic silicon precursor material, with the layer of oxygen material nitrogen material being formed in such a manner that an area free of material remains between the interconnects, in which an intermediate layer composed of electrically insulating material is applied to the layer of oxygen material nitrogen material, and in which a covering layer is selectively applied to the intermediate layer, by means of which the material-free area between the electrically conductive structures is sealed from the environment, so that the material-free area forms a cavity.

Furthermore, a layer arrangement is provided,
having a substrate;
having two electrically conductive structures on the substrate, with at least a subarea between the two electrically conductive structures being free of material;
having a layer of material containing silicon, oxygen and nitrogen, which has been formed by means of a plasma-enhanced chemical vapor deposition process, with nitrogen material being supplied, during the supply of silicon material and oxygen material, by means of an organic silicon precursor material, with the layer being applied to the two electrically conductive structures in such a manner that an area free of material remains between the two electrically conductive structures,
having an intermediate layer composed of electrically insulating material on the layer composed of material containing silicon, oxygen and nitrogen;
having a covering layer, which is formed selectively on the intermediate layer, by means of which the material-free area between the two electrically conductive structures is sealed from the environment.

In particular, as can be seen, the invention has identified that the material of the covering layer is not deposited on the material containing silicon, oxygen and nitrogen formed in the manner described above, thus resulting in selective deposition of the covering layer only on the intermediate layer in order to "close the airgaps", without reducing the width of the airgap between the conductive structures. This results in the airgaps being closed by means of the covering layer in a very simple manner, with one additional advantage being the low relative dielectric constant of the material containing silicon, oxygen and nitrogen.

Preferred developments of the invention result from the dependent claims.

A material containing oxygen is preferably used as the organic silicon precursor material. This material containing oxygen may be used as an oxygen source in order to form the material according to the invention containing silicon, oxygen and nitrogen.

It is particularly advantageous to use tetraethyl orthosilicate (TEOS), that is to say $(C_2H_5O)_4Si$, as the precursor material. This material represents a particularly advantageous silicon source and oxygen source for the material containing silicon, oxygen and nitrogen, according to the invention, in which nitrogen material, which is introduced simultaneously, is incorporated as a result of the chemical processes during decomposition of the TEOS material.

Alternatively, but still within the scope of the invention, the following materials may be used, for example, as an organic silicon precursor material, methyltriethoxysilane (MTrEOS), dimethyldiethoxysilane (DMDEOS), trimethylethoxysilane (TrMEOS) and/or tetramethylsilane (TMS).

Tetraethyl orthosilicate (TEOS) and nitrogen ($N_2$) are preferably used as precursors for the plasma-enhanced chemical vapor deposition process according to the invention, with the flow-rate ratio of tetraethyl orthosilicate to nitrogen being set between 1:10 and 1:1. The flow-rate ratio is the quotient of the flow rates (for example in SCCM, standard cubic centimeters per minute) of the two individual components.

Furthermore, the flow-rate ratio of tetraethyl orthosilicate to nitrogen is preferably set between 1:5 and 1:2.

It is particularly advantageous to set the flow-rate ratio of tetraethyl orthosilicate to nitrogen between 11:40 and 7:20.

Helium can be supplied as a carrier gas during the plasma-enhanced chemical vapor deposition process.

The pressure in the process chamber is preferably set between 440 Pa and 1750 Pa, furthermore preferably between 700 Pa and 1100 Pa.

The temperature in the process chamber can advantageously be between 300° C. and 500° C., with a temperature between 380° C. and 430° C. being particular advantageous.

The material containing silicon, oxygen and nitrogen according to the invention and produced using the plasma-enhanced chemical vapor deposition process according to the invention will be described in more detail in the following text. Refinements of the plasma-enhanced chemical vapor deposition process also apply to the material containing silicon, oxygen and nitrogen, and refinements of the material containing silicon, oxygen and nitrogen also apply to the plasma-enhanced chemical vapor deposition process.

The material containing silicon, oxygen and nitrogen preferably contains between 0.1 percent by atomic weight and 10 percent by atomic weight of nitrogen. The material according to the invention furthermore preferably contains between 0.5 percent by atomic weight and 5 percent by atomic weight of nitrogen. It is particularly advantageous for the parameters for the plasma-enhanced chemical vapor deposition process to be set in such a manner that the material contains between 1.4 percent by atomic weight and 2.3 percent by atomic weight of nitrogen. This makes it possible to achieve a particular good balance between a low dielectric constant and particularly poor selectivity with regard to the growth of ozone/TEOS.

The ratio, in terms of percentage by atomic weight, between oxygen and silicon is preferably between 1.8 and 1.99. In other words, the material containing silicon, oxygen and nitrogen is modified in comparison to stoichiometric silicon oxide with a ratio, in terms of percentage by atomic weight, between oxygen and silicon of two, such that oxygen material is clearly (at least partially) replaced by the additional nitrogen material.

In addition to the silicon material, the oxygen material and the nitrogen material, the material according to the invention may have between 0.4 percent by atomic weight and 2.4 percent by atomic weight of carbon. It is also possible for the carbon to contribute to the advantageous material characteristics, since the aim according to the invention is achieved only by using an organic silicon precursor material, that is to say one containing carbon.

Furthermore, the material according to the invention and containing silicon, oxygen and nitrogen may have between 3 percent by atomic weight and 13 percent by atomic weight of hydrogen.

Particularly advantageous material characteristics are achieved by a material with the overall formula $Si_{1.00}O_{1.90}H_{0.27}C_{0.045}N_{0.06}$. Each of the index numbers (1.00, 1.90, etc.) in the stated overall formula may vary by twenty percent upwards or downwards, furthermore preferably by 10 percent, and even further preferably by 3 percent, without losing the advantageous characteristics of the material.

Refinements of the layer arrangement according to the invention will be described in the following text. Refinements of the material containing silicon, oxygen and nitrogen also apply to the layer arrangement, and vice versa.

In the case of the layer arrangement according to the invention, the intermediate layer may be formed from silane-based ($SiH_4$) silicon oxide. If a covering layer composed of silicon oxide is then selectively deposited, and is formed on the basis of ozone-activated tetraethyl orthosilicate, then this results in a layer arrangement which is reliably closed off from the exterior, since the material of the covering layer can clearly grow over a trench in the layer arrangement. At the same time, the material combination prevents the trench from being partially filled with covering-layer material during the growth of a covering layer such as this, which results from the poor deposition capability of the material of the covering layer on the material according to the invention within the trench.

It should be noted that the precise process parameters for production of the material according to the invention depend on the process chamber etc.

BRIEF DESCRIPTION OF DRAWINGS

Exemplary embodiments of the invention will be explained in more detail in the following text and are illustrated in the figures, in which.

Identical or similar components in the various figures are provided with the same reference numbers.

Figure 1:
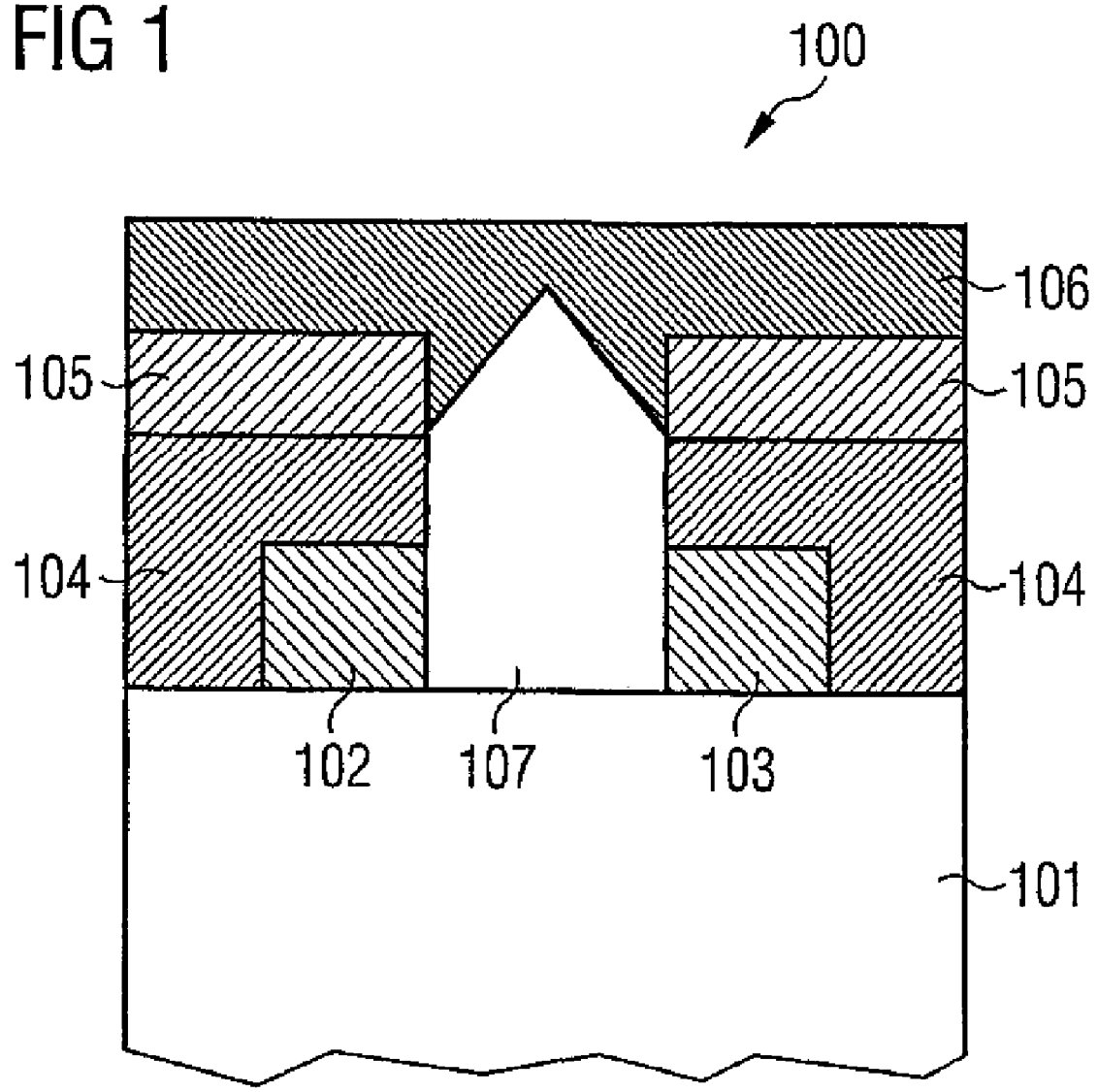
FIG. 1 shows a cross-sectional view of a layer arrangement according to a first exemplary embodiment of the invention

The illustrations in the figures are schematic, and not to scale.

DETAILED DESCRIPTION

TABLE 1

| Step | 1. Fill | 2. STAB | 3. DEPOSIT | 4. PUMP |
|---|---|---|---|---|
| Process chamber | Only A | Only A | Only A | Only A |
| Step end control | By time | By time | By time | By time |
| Maximum step time | 10.0 s | 10.0 s | 60.0 s | 5.0 s |
| End point selection | No end point | No end point | No end point | No end point |
| Pressure | Controlled to 880 Pa | Controlled to 880 Pa | Controlled to 880 Pa | Restrictor fully open |
| RF power, match, mode | 0 W, auto, B-to-B | 0 W, auto, B-to-B | 900 W, auto, B-to-B | 0 W, auto, B-to-B |
| RF2 tune nominal value | 0.0 V | 0.0 V | 0.0 V | 0.0 V |
| RF2 power, match | 0 W, auto | 0 W, auto | 0 W, auto | 0 W, auto |
| Temperature susceptor | 415° C. | 400° C. | 400° C. | 400° C. |
| Temperature ramp | 0.0° C./s | 0.0° C./s | 0.0° C./s | 0.0° C./s |
| Purge | Off | Off | Off | Off |
| Susceptor spacing | 250 mils | 250 mils | 250 mils | 250 mils |
| Gas flows | O2: 700 sccm | O2: 155 sccm He: 850 sccm | O2: 150 sccm He: 700 sccm | He: 2500 sccm TEOS: 700 sccm N2: 2000 sccm |

TABLE 1-continued

| | TEOS: 550 sccm N2: 2000 sccm | | TEOS: 550 sccm N2: 2000 sccm |
|---|---|---|---|

Table 1 shows the steps and parameters for a process procedure for a "P5000" installation from the Applied Materials™ Company by means of which material containing silicon, oxygen and nitrogen (that is to say a modified PE-TEOS layer) can be produced according to one preferred exemplary embodiment of the invention.

The procedure for this process for the production of the material according to the invention containing silicon, oxygen and nitrogen will be described in the following text, on the basis of one preferred exemplary embodiment of the invention with reference to Table 1.

First of all, in a first step, the so-called gas filling step, the pressure in the process chamber is set to 880 Pa with a maximum step time of 10.0 s. With the radio-frequency power switched off, the temperature of the susceptor is raised from the standard temperature of 400° C. to 415° C., so that the susceptor does not cool down when the cold silicon wafer is subsequently introduced. The gas flows are set to be 700 sccm (standard cubic centimeters per minute) for an $O_2$ component (oxygen), 2500 sccm for a helium carrier gas, a flow rate of 700 sccm for TEOS as an organic silicon precursor, and a flow rate of 2000 sccm for nitrogen.

In a second process step, referred to as a stabilization step, the maximum step time of 10.0 s is kept to. The pressure in the process chamber is still kept at 880 Pa. The temperature of the susceptor is then changed to 400° C., without radio-frequency power, and the gas flows are modified such that the $O_2$ component is changed to 155 sccm, the helium carrier-gas component to 850 sccm, the TEOS component to 550 sccm, and the nitrogen component to 2000 sccm.

In a third process step, which is referred to as the deposition step, the step time is set as appropriate for the desired layer thickness. A step time of 60.0 s, for example, results in the growth of a layer with a thickness of about 450 nm. The pressure in the chamber is kept at 880 Pa, and radio frequency is applied, with a power level of 900 W. The temperature of the susceptor is kept at 400° C. The gas flows are set as follows: the $O_2$ component is set to 150 sccm, the helium component to 700 sccm, the TEOS component is controlled at 550 sccm, and the nitrogen component is controlled at 2000 sccm.

In a fourth method step, referred to here as the pumping process, the maximum step time is reduced to 5 s. With regard to the pressure, the restrictor is opened completely, and the radio-frequency power is reduced to 0 W. Furthermore, the gas flows of oxygen, helium, TEOS and nitrogen are reduced.

A layer arrangement 100 according to a first exemplary embodiment of the invention will be described in the following text with reference to FIG. 1.

The layer arrangement 100 has a silicon substrate 101, on which a first copper interconnect 102 and a second copper interconnect 103 are formed. The area between the two electrically conductive structures 102, 103 is free of material, specifically the area of airgaps 107. $Si_{1.00}O_{1.90}H_{0.27}C_{0.045}N_{0.06}$ material 104 produced according to the invention is formed on the two electrically conductive structures 102, 103. A silane-based silicon-oxide intermediate layer 105 is applied to the $Si_{1.00}O_{1.90}H_{0.27}C_{0.045}N_{0.06}$ material 104. An ozone/TEOS covering layer 106 is formed (that is to say silicon oxide formed by ozone-activated decomposition of tetraethyl orthosilicate) on the silane-based silicon-oxide intermediate layer 105, by means of which the material-free area 107 between the two electrically conductive structures 102, 103 is sealed from the environment.

The $Si_{1.00}O_{1.90}H_{0.27}C_{0.045}N_{0.06}$ material 104 according to the invention partially covers the copper interconnects 102, 103. The material according to the invention has substantially the same dielectric characteristics as those of silicon oxide. The effective dielectric constant of the area between the interconnects 102, 103 which is formed by the airgaps 107 with $\in_r$ of approximately unity (and possibly $Si_{1.00}O_{1.90}H_{0.27}C_{0.045}N_{0.06}$ material 104 with $\in_r$ of approximately 3.9) is thus very low. Thus, when signals are applied to the copper interconnects 102, 103, the RC signal delay times are short, thus avoiding undesirable crosstalk between the interconnects 102, 103. During closure or sealing, that is to say during complete coverage, of the trench which is formed from components 102 to 105, the ozone/TEOS covering layer 106 is formed selectively only on the silane-based silicon-oxide intermediate layer 105, thus avoiding undesirable selective deposition of covering layer material on the $Si_{1.00}O_{1.90}H_{0.27}C_{0.045}N_{0.06}$ material 104 because of the nitrogen component contained in the $Si_{1.00}O_{1.90}H_{0.27}C_{0.045}N_{0.06}$ material 104 according to the invention. The covering layer 106 can thus reliably seal the cavity from the exterior, without any material being undesirably introduced into the airgaps 107, which would lead to an undesirable increase in the effective $\in_r$ value between the interconnects 102, 103.

Differences between a conventional material and the material provided according to the invention will be described in the following text with reference to FIG. 2 and FIG. 3 and using electron-microscope photographs.

Figure 2:
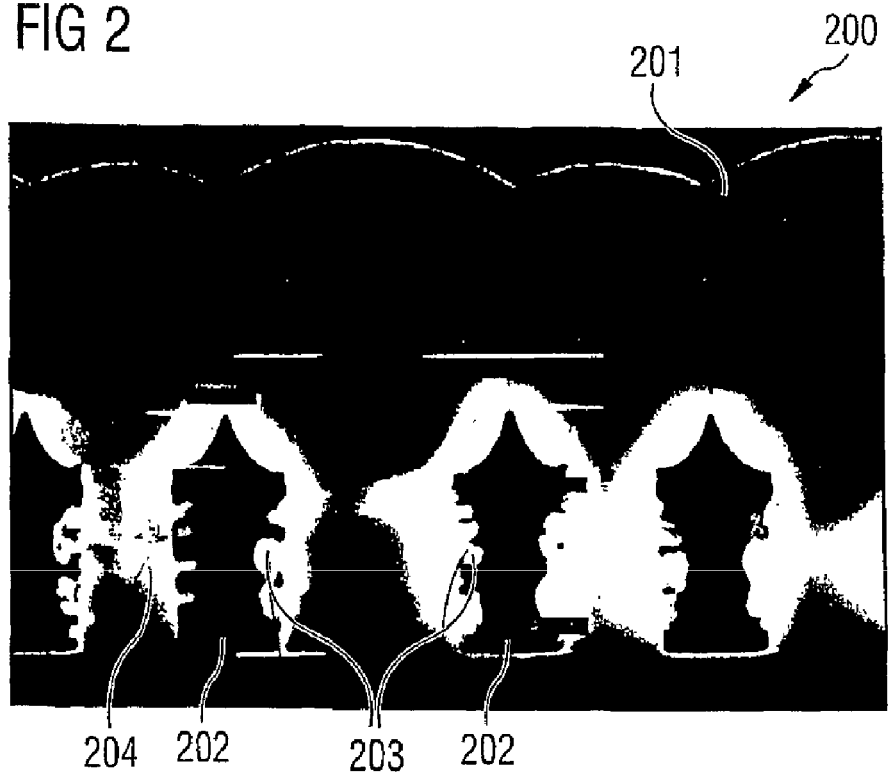
FIG. 2 shows an electron-microscope cross-sectional view of a layer arrangement without use of the material according to the invention.

FIG. 2 shows an electron-microscope photograph 200 of a cross-sectional view of a layer arrangement in which conventional TEOS material has been used as the dielectric 204 between airgaps 202. As can be seen from FIG. 2, during the formation of a covering layer 201 by means of a selective $O_3$/TEOS deposition process, an edge area 203 between the airgaps 202 and the dielectric 204 has been undesirably covered with material, thus undesirably increasing the dielectric constant of the airgap area.

Figure 3:
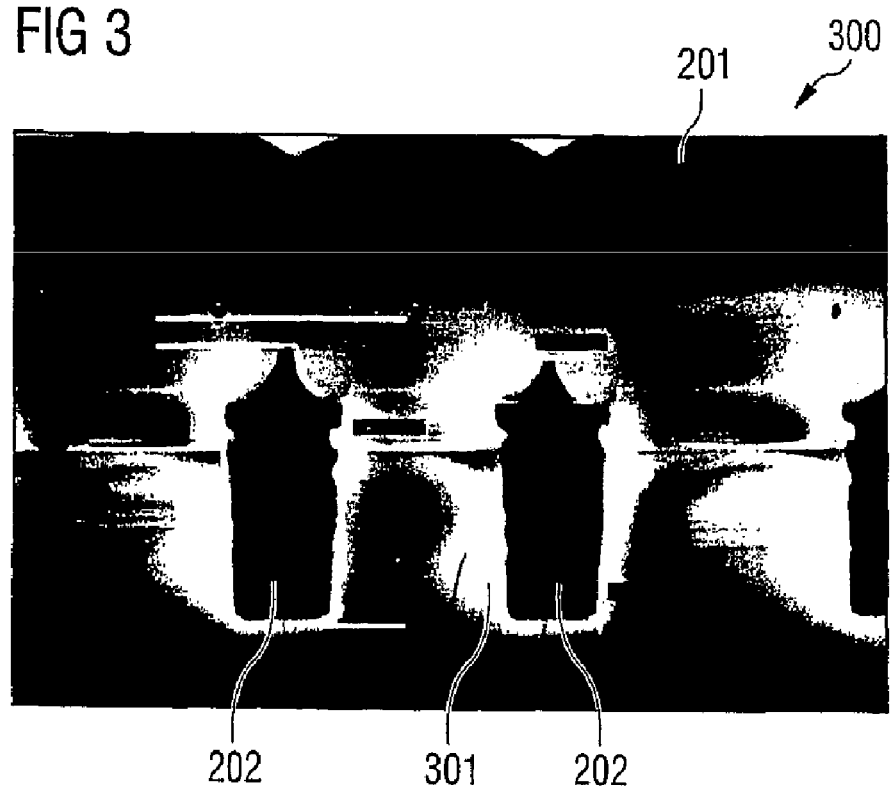
FIG. 3 shows an electron-microscope cross-sectional view of a layer arrangement using the material according to the invention.

In contrast to this, the electron-microscope photograph 300 shown in FIG. 3 shows a layer arrangement according to the invention in which a covering layer 201, formed by means of a selective ozone/TEOS deposition process, does not form any structures on sidewalls of airgaps 202. This is because $Si_{1.00}O_{1.90}H_{0.27}C_{0.045}N_{0.06}$ material 301 is used as the material between airgaps 202 according to the invention, instead of the conventional dielectric layer 204 from FIG. 2. This results in a low dielectric constant in the area of the airgaps 202, which is extremely advantageous for low-k applications.

Figure 4:
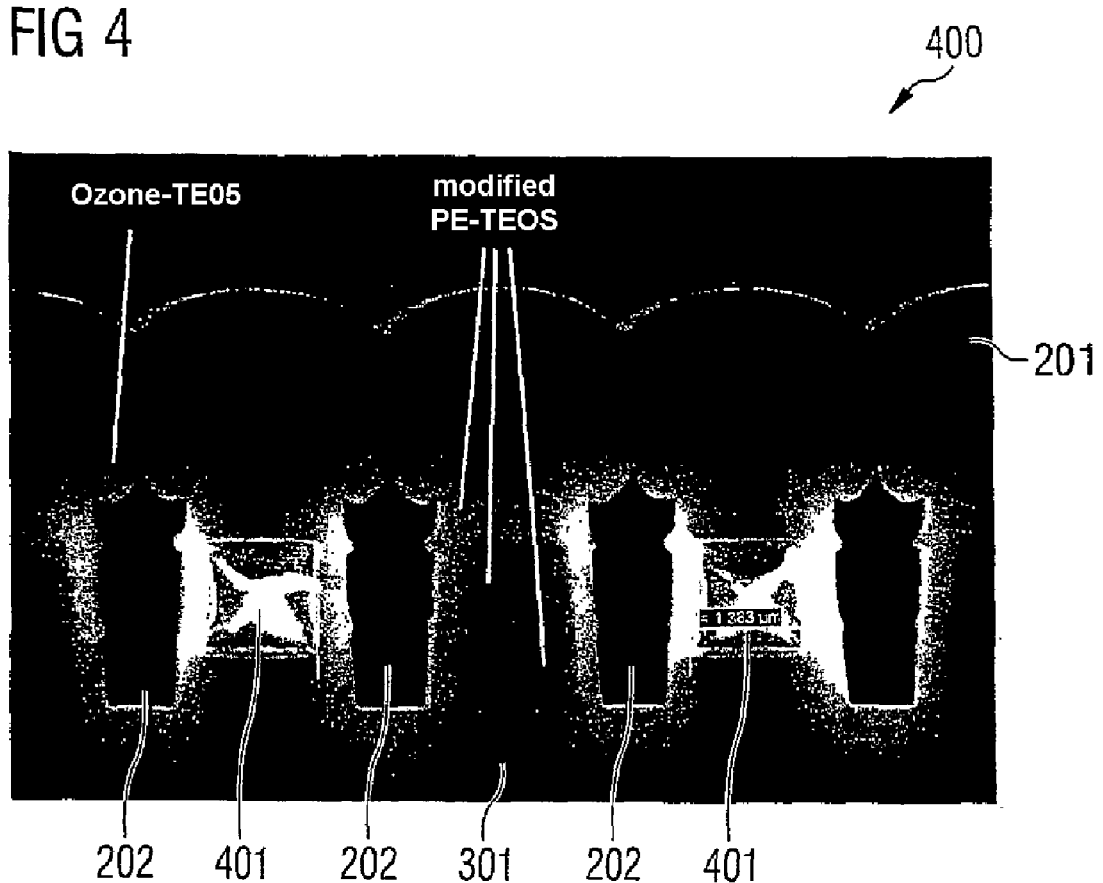
FIG. 4 shows another electron-microscope cross-sectional view of a layer arrangement using the material according to the invention.

FIG. 4 shows another electron-microscope photograph 400 in the form of a cross-sectional view of a layer arrangement according to the invention, in which copper interconnects 401 are formed in addition to the components shown in FIG. 3. Since the effective relative dielectric constant between the copper interconnects 401 is reduced because of the material 301 according to the invention between the airgaps 202 (since, according to the invention, undesirable side-wall coverage of the airgaps 202 with ozone/TEOS material of a covering layer 201 is avoided), the RC delay times of the circuit arrangement 400 shown in FIG. 4 are significantly better than those in the prior art.

Figure 5:
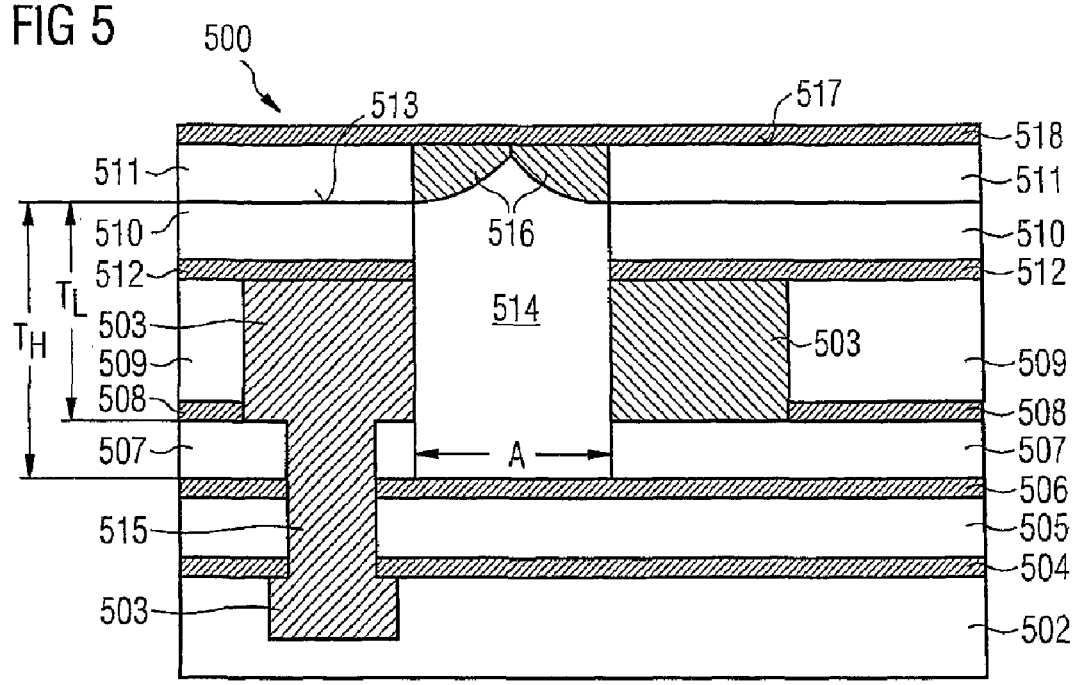
FIG. 5 shows a cross-sectional view of a layer arrangement according to a second exemplary embodiment of the invention.

A cross-sectional view of a layer arrangement 500 according to a second exemplary embodiment of the invention will be described in the following text with reference to FIG. 5.

The interconnect arrangement 500 has a base substrate 502. Silicon dioxide ($SiO_2$) is chosen as the material for this base substrate 502. Two interconnects 503 composed of aluminum or copper are formed in the base substrate 502.

Both the interconnects 503 and the base substrate 502 are covered by a first stop layer 504. A layer stack comprising, successively, a first isolation layer 505, a second stop layer 506, a second isolation layer 507, a third stop layer 508, a third isolation layer 509, a buffer layer 510 and a supporting layer 511 is arranged above the first stop layer 504.

According to this exemplary embodiment, the first stop layer 504, the second stop layer 506, the third stop layer 508 and a fourth stop layer 512 are each formed from silicon nitride ($Si_3N_4$), which is electrically insulating. According to this exemplary embodiment, $Si_{1.00}O_{1.90}H_{0.27}C_{0.045}N_{0.06}$ material produced according to the invention is used as the material for the first isolation layer 505, for the second isolation layer 507, for the third isolation layer 509 and for the buffer layer 510. Plasma-enhanced silicon dioxide ($SiO_2$) based on silane ($SiH_4$) is used for the supporting layer 511 (also referred to as the intermediate layer). In this case, the plasma-enhanced silicon dioxide ($SiO_2$) based on silane ($SiH_4$) is normally deposited using a PECVD process (PECVD, "plasma enhanced chemical vapor deposition").

The base substrate 502, the first stop layer 504, the first isolation layer 505, the second stop layer 506, the second isolation layer 507, the third stop layer 508, the third isolation layer 509 and the fourth stop layer 512 are formed in the rising direction of the layer stack. The buffer layer 510 is bounded at the top by a buffer layer surface 513. A cavity 514 is formed in the buffer layer 510 and in the layers arranged underneath it, projects from the buffer layer surface 513 as far as the second stop layer 506 into the layers arranged underneath, and has a cavity depth $T_H$.

The cavity 514 isolates the two interconnects 503, which are arranged such that they are buried, partially replace the third stop layer 508 and the third isolation layer 509, and together define an interconnect layer. The interconnects 503 which are electrically isolated by means of the cavity 514 are arranged alongside one another with an interconnect separation A in such a manner that the respective lower interconnect surface is at a distance corresponding to an interconnect depth $T_L$ at right angles to the buffer layer surface 513, with this depth being greater than the vertical thickness of the interconnects 503. The cavity depth $T_H$ is greater than the interconnect depth $T_L$, thus reducing stray fields between adjacent interconnects 503 in the areas of the buffer layer 510 directly above and below the interconnects 503. The cavity 514 has a width which is equal to the interconnect separation A.

The interconnects 503, which partially replace the third stop layer 508 and the third isolation layer 509, are electrically coupled by means of an electrical contact 515 to the interconnect 503 which is located in the base substrate 502, and, according to this exemplary embodiment, are made of the same material as the interconnect 503 which is located in the base substrate 502. For this purpose, the electrical contact 515 passes through the first stop layer 504, the first isolation layer 505, the second stop layer 506 and the second isolation layer 507.

Furthermore, the buffer layer 510 and the supporting layer 511 are located one above the other, with the cavity 514 projecting through the buffer layer 510, and projecting partially into the supporting layer 511.

The cavity 514 is closed at the top with respect to the buffer layer surface 513 by means of a covering layer 516. The covering layer 516 is made of an isolation material which is deposited selectively and exclusively on the supporting layer 511. Silicon-dioxide ($SiO_2$) based on ozone-activated tetra-ethyl orthosilicate ($O_3$/TEOS) is used as the material for the covering layer 516. A different material may, of course, also be chosen for the covering layer 516, provided that this has the selectivity with regard to its deposition behavior as described above. The covering layer 516 is clearly designed in such a manner that it has a cutout, in the form of a gap, facing the cavity 514. In consequence, the supporting layer 511 should have an adequate depth at right angles to the buffer layer surface 513 such that the cavity 514 is also completely closed by the covering layer 516 above the cutout, in the form of a gap, in the covering layer 516.

The covering layer 516 as well as the supporting layer 511 have a common covering layer/supporting layer surface 517, which bounds these two layers 516, 511 at the top, essentially parallel to the substrate surface 501. Finally, a fifth stop layer 518 is also arranged on this covering layer/supporting layer surface 517, to which additional interconnect layers can be applied.

The geometry of the cavity 514 is preferably chosen such that the interconnect arrangement 500 has sufficiently good electrical isolation between the interconnects 503 within one interconnect layer, with an adequate reduction in the relative dielectric constant $\in_r$. According to this exemplary embodiment, the interconnect separation A and thus the cavity 514 have a width from 400 nm to 500 nm, which is virtually the same as the width of the interconnects 503. According to this exemplary embodiment, the cavity depth $T_H$ has a value which corresponds to twice the thickness of the interconnects 503. According to this exemplary embodiment, the interconnects 503 have a thickness of approximately 600 nm. According to the present exemplary embodiment, the individual stop layers each have a thickness of approximately 50 nm. The isolation layers apart from the third isolation layer 509 as well as the buffer layer 510 and the supporting layer 511 each have a thickness of approximately 150 nm according to the present exemplary embodiment. Alternatively, other suitable dimensions may, of course, also be chosen.

Either the damascene technique or the metal-etching technique may be used to produce the interconnects 503. The damascene technique is preferably used when copper is used as the material for the interconnects 503, while the metal-etching technique is preferably used when aluminum is used as the material for the interconnects 503.

In the case of one exemplary embodiment of the invention, which is not illustrated but is essentially the same as the second exemplary embodiment of the invention which has just been described, the cavity 514 may additionally also extend through the second stop layer 506 to the boundary surface between the second stop layer 506 and the first isolation layer 505. Obviously, so much material is removed from the second stop layer 506 in the area of the cavity 514 in order to enlarge the cavity 514 that the first isolation layer 505, located underneath, is just exposed. This results in the effective relative dielectric constant $\in_r$ additionally being reduced. This is because the larger cavity 514 additionally reduces interfering electrical stray fields between the interconnects 503.

Figure 6:
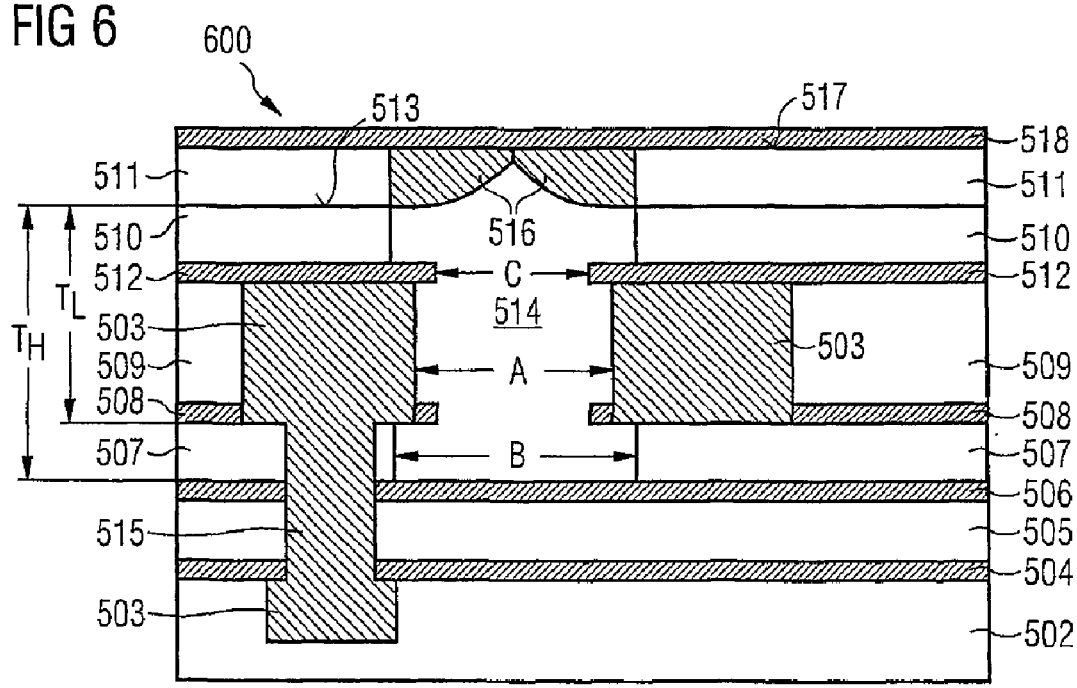
FIG. 6 shows a cross-sectional view of a layer arrangement according to a third exemplary embodiment of the invention.

FIG. 6 shows a cross-sectional view of a layer arrangement 600 (also referred to as an interconnect arrangement 600) according to a third exemplary embodiment of the invention.

The interconnect arrangement 600 according to the third exemplary embodiment is essentially identical to the interconnect arrangement 500 according to the second exemplary embodiment. The differences between the interconnect arrangement 600 according to the third exemplary embodiment and the interconnect arrangement 500 according to the second exemplary embodiment are as follows: the cavity 514 has a cavity width B parallel to the plane of the drawing with respect to the substrate surface 501, and this width B is greater than the interconnect separation A. This means that the shape of the cavity 514 is clearly comparable to an "I", or to a bone. The greater extent of the cavity 514 above and below the interconnect layer formed by the adjacent interconnects 503 contributes to an additional reduction in the effective relative dielectric constant $\in_r$ in the interconnect arrangement 600. This is because the larger cavity 514 additionally reduces disturbing electrical stray fields between the interconnects 503.

The third stop layer 508 and the fourth stop layer 512 have a hole width C which is less than the interconnect separation A, in the area of the cavity 514. This is a consequence of the special production process, by means of which the curved cavity 514 is produced in the interconnect arrangement 600 according to the third exemplary embodiment.

One important aspect of the interconnect arrangements 500, 600 according to the invention is that the $Si_{1.00}O_{1.90}H_{0.27}C_{0.045}N_{0.06}$ material according to the invention, produced by means of a PECVD process, is used as the material for the layers 505, 507, 509, 510. Exposed surface areas in particular of the layers 507, 510 are reliably protected, by means of a selective deposition process during the subsequent formation of the ozone/TEOS covering layer 516, against being undesirably covered with material of the covering layer 516, since this would lead to partial filling of the cavity 514. This would in turn undesirably increase the effective relative dielectric constant of the area between the interconnects 503. Owing to the provision of the layers 505, 507, 509, 510 composed of $Si_{1.00}O_{1.90}H_{0.27}C_{0.045}N_{0.06}$ material, which, because of its material composition, is protected against selective deposition of material of the ozone/TEOS covering layer 516, the covering layer 516 is deposited selectively during the ozone/TEOS deposition process only on those surface areas of the supporting layer 511 which are composed of silane-based silicon oxide, so that the material of the covering layer 516 grows over the cavity 514, thus closing it.

The following publications are cited in this document:
[1] WO 03/019649 A2;
[2] DE 101 25 019 A1;
[3] DE 191 09 778 A1;
[4] DE 199 57 302 A1;
[5] DE 41 18 165 A1;
[6] US 2001/0 019 903 A1;
[7] JP 06-216 122 A;
[8] U.S. Pat. No. 6,211,057 B1;
[9] US 2003/0 176 055 A1.

| List of reference symbols | |
|---|---|
| 100 | Layer arrangement |
| 101 | Silicon substrate |
| 102 | First copper interconnect |
| 103 | Second copper interconnect |
| 104 | $Si_{1.00}O_{1.90}H_{0.27}C_{0.045}N_{0.06}$ material |
| 105 | Silane-based silicon-oxide intermediate layer |
| 106 | Ozone/TEOS covering layer |
| 107 | Airgap |
| 200 | Electron-microscope photograph |

-continued

| | List of reference symbols |
|---|---|
| 201 | Covering layer |
| 202 | Airgaps |
| 203 | Side wall cover |
| 204 | Dielectric |
| 300 | Electron-microscope photograph |
| 301 | $Si_{1.00}O_{1.90}H_{0.27}C_{0.045}N_{0.06}$ material |
| 400 | Electron-microscope photograph |
| 401 | Copper interconnects |
| 500 | Layer arrangement |
| 502 | Base substrate |
| 503 | Interconnect |
| 504 | First stop layer |
| 505 | First isolation layer |
| 506 | Second stop layer |
| 507 | Second isolation layer |
| 508 | Third stop layer |
| 509 | Third isolation layer |
| 510 | Buffer layer |
| 511 | Supporting layer |
| 512 | Fourth stop layer |
| 513 | Buffer-layer surface |
| 514 | Cavity |
| 515 | Electrical contact |
| 516 | Covering layer |
| 517 | Covering layer/supporting-layer surface |
| 518 | Fifth stop layer |
| 600 | Layer arrangement |

The invention claimed is:

1. A semiconductor structure comprising:
a substrate;
two electrically conductive structures over the substrate, a subarea between the two electrically conductive structures being free of material;
a layer including a compound comprising silicon, oxygen and nitrogen overlying the two electrically conductive structures;
an intermediate layer comprising an electrically insulating material overlying the layer of material containing silicon, oxygen and nitrogen; and
a covering layer overlying the intermediate layer and the subarea between the two electrically conductive structures such that the subarea comprises a material-free area that is sealed from the environment.

2. The semiconductor structure as claimed in claim 1, the layer of including a compound comprising silicon, oxygen and nitrogen comprises $Si_{1.00}O_{1.90}H_{0.27}C_{0.045}N_{0.06}$, wherein each of the index numbers (1.00, 1.90, 0.27, 0.045, 0.06) is variable by 20% upwards or downwards.

3. The semiconductor structure as claimed in claim 1, wherein the two electrically conductive structures comprise copper structures.

4. The semiconductor structure as claimed in claim 1, wherein the material-free area comprises an airgap.

5. The semiconductor structure as claimed in claim 1, the layer including a compound comprising silicon, oxygen and nitrogen has been formed by a plasma-enhanced chemical vapor deposition process with nitrogen material being supplied during the supply of silicon material and oxygen material by means of an organic silicon precursor material.

6. The semiconductor structure as claimed in claim 1, wherein the intermediate layer is formed from silane-based silicon oxide.

7. The semiconductor structure as claimed in claim 1, wherein the covering layer comprises silicon oxide.

8. The semiconductor structure as claimed in claim 7, wherein the covering layer is formed based on ozone-activated decomposed tetraethyl orthosilicate.

9. A semiconductor structure comprising: two electrically conductive structures over a substrate, a subarea between the two electrically conductive structures being free of material; a layer including a compound comprising silicon, oxygen and nitrogen overlying the two electrically conductive structures, the layer including a compound comprising silicon, oxygen and nitrogen comprises $Si_{1.00}O_{1.90}H_{0.27}C_{0.045}N_{0.06}$, wherein each of the index numbers (1.00, 1.90, 0.27, 0.045, 0.06) is variable by 20% upwards or downwards.

10. The semiconductor structure as claimed in claim 9, wherein the two electrically conductive structures comprise copper structures.

11. The semiconductor structure as claimed in claim 9, wherein the material-free area comprises an airgap.

12. The semiconductor structure as claimed in claim 9, wherein the layer of material containing silicon, oxygen and nitrogen has been formed by a plasma-enhanced chemical vapor deposition process with nitrogen material being supplied during the supply of silicon material and oxygen material by means of an organic silicon precursor material.

13. The semiconductor structure as claimed in claim 9, wherein the intermediate layer is formed from silane-based silicon oxide.

14. The semiconductor structure as claimed in claim 9, wherein the covering layer comprises silicon oxide.

15. The semiconductor structure as claimed in claim 14, wherein the covering layer is formed based on ozone-activated decomposed tetraethyl orthosilicate.

16. A method for producing a layer arrangement, the method comprising:
forming a layer including a compound comprising silicon, oxygen, and nitrogen over a substrate that has a plurality of electrically conductive structures and/or over a part of a surface of the electrically conductive structures, the layer including a compound comprising silicon, oxygen, and nitrogen being formed using a plasma-enhanced chemical vapor deposition process with nitrogen being supplied during the supply of silicon and oxygen by means of an organic silicon precursor material, the layer including a compound comprising silicon, oxygen, and nitrogen being formed in such a manner that an area free of material remains between the electrically conductive structures;
forming an intermediate layer comprising an electrically insulating material over the layer including a compound comprising silicon, oxygen, and nitrogen; and
selectively forming a covering layer over the intermediate layer such that the area free of material between the electrically conductive structures is sealed from the environment and forms a cavity.

17. The method as claimed in claim 16, the layer including a compound comprising silicon, oxygen and nitrogen comprises $Si_{1.00}O_{1.90}H_{0.27}C_{0.045}N_{0.06}$, wherein each of the index numbers (1.00, 1.90, 0.27, 0.045, 0.06) is variable by 20% upwards or downwards.

* * * * *